United States Patent
Tsubokura et al.

(10) Patent No.: US 7,342,810 B2
(45) Date of Patent: Mar. 11, 2008

(54) DISPLAY DEVICE

(75) Inventors: Masaki Tsubokura, Mobara (JP); Shinichi Iwasaki, Mobara (JP); Chiaki Notsu, Mobara (JP); Mitsuo Saitou, Misaki (JP)

(73) Assignee: Hitachi Displays, Ltd., Chiba (JP)

( * ) Notice: Subject to any disclaimer, the term of this patent is extended or adjusted under 35 U.S.C. 154(b) by 225 days.

(21) Appl. No.: 11/062,464

(22) Filed: Feb. 22, 2005

(65) Prior Publication Data
US 2005/0190334 A1 Sep. 1, 2005

(30) Foreign Application Priority Data
Feb. 25, 2004 (JP) ............................. 2004-050058

(51) Int. Cl.
*H05K 1/11* (2006.01)
(52) U.S. Cl. ................................... 361/803
(58) Field of Classification Search ................ 361/803, 361/801, 802; 349/150
See application file for complete search history.

(56) References Cited

U.S. PATENT DOCUMENTS 6,836,310 B2 * 12/2004 Yamazaki et al. .......... 349/150
2001/0046021 A1 * 11/2001 Kozuka et al. ............. 349/150
2004/0017536 A1 * 1/2004 Takenaka ..................... 349/150
2004/0174487 A1 * 9/2004 Yamazaki et al. .......... 349/150

* cited by examiner

*Primary Examiner*—Tuan T. Dinh
*Assistant Examiner*—Abiy Getachew
(74) *Attorney, Agent, or Firm*—Reed Smith LLP; Stanley P. Fisher, Esq.; Juan Carlos A. Marquez, Esq.

(57) ABSTRACT

The present invention can reduce the warping of the printed circuit board of a display device. This advantage can be obtained by providing a display device which includes a display element; a printed circuit board which is arranged in a state that the printed circuit board extends over a peripheral portion of the display element; and a plurality of flexible printed circuit boards which connect the display element and the printed circuit board, wherein the printed circuit board is connected with the plurality of flexible printed circuit boards using a plurality of connection terminal groups corresponding to the plurality of flexible printed circuit boards, dummy terminal groups are provided between the plurality of connection terminal groups, and the dummy terminal groups are arranged on a side close to the display element side and a side remote from the display element side in the direction orthogonal to the extension direction of the printed circuit board in a state that respective dummy terminal rates are made close to each other.

6 Claims, 2 Drawing Sheets

DISPLAY DEVICE

BACKGROUND OF THE INVENTION

The present invention relates to a display device, and more particularly to a display device which connects a display element (CEL) of a display device and a printed circuit board (PCB) which is arranged in a periphery of the display element using a plurality of flexible printed circuit board (TCP).

As a display device, there has been known a display device which connects a display element of the display device and a printed circuit board which is arranged in a periphery of the display element using a plurality of flexible printed circuit boards. Further, as such a printed circuit board, there has been known a printed circuit board which arranges terminals and dummies besides these terminals thereon. As a literature which discloses such a technique, Japanese Patent Laid-open No. 90856/2003 (literature 1) is named.

BRIEF SUMMARY OF THE INVENTION

However, it has been found out that the display device having such a constitution generates warping on the printed circuit board (PCB).

The present invention has been made under such circumstances and it is an object of the present invention to provide a display device which connects a display element of the display device and a printed circuit board which is arranged in a periphery of the display element using a plurality of flexible printed circuit board and terminals and dummies besides the terminals are arranged on the printed circuit board, wherein the display device can reduce the warping of the printed circuit board.

To briefly explain representative examples of the present invention disclosed in this specification, they are as follows.

(1) The display device according to the present invention is, for example, characterized in that the display device includes: a display element; a printed circuit board which is arranged in a state that the printed circuit board extends over a peripheral portion of the display element; and a plurality of flexible printed circuit boards which connect the display element and the printed circuit board, wherein the printed circuit board is connected with the plurality of flexible printed circuit boards using a plurality of connection terminal groups corresponding to the plurality of flexible printed circuit boards, dummy terminal groups are provided between the plurality of connection terminal groups, and the dummy terminal groups are arranged on a side close to the display element side and a side remote from the display element side in the direction orthogonal to the extension direction of the printed circuit board in a state that respective dummy terminal rates are made close to each other.

(2) The display device according to the present invention is, for example, on the premise of the constitution (1), characterized in that the dummy terminal groups include the first dummy terminal group which is arranged on the display element side and the second dummy terminal group which is arranged on the side remote from the display element.

(3) The display device according to the present invention is, for example, on the premise of the constitution (2), characterized in that the second dummy terminal group is formed contiguously with the connection terminal group in the extending direction of the printed circuit board.

(4) The display device according to the present invention is, for example, on the premise of the constitution (3), characterized in that notches are formed corresponding to a region of the printed circuit board where the dummy terminal group is arranged and on the side remote from the display element of the printed circuit board.

(5) The display device according to the present invention is, for example, on the premise of the constitution (3) or (4), characterized in that an anisotropic conductive film which is contiguously formed with the connection terminal group of the printed circuit board and the second dummy terminal group is arranged.

Here, the present invention is not limited to the above-mentioned constitutions and various modifications can be made without departing from the technical concept of the present invention.

DETAILED DESCRIPTION OF THE INVENTION

Hereinafter, embodiments of a liquid crystal display device according to the present invention are explained in conjunction with drawings.

Embodiment 1

Figure 1:
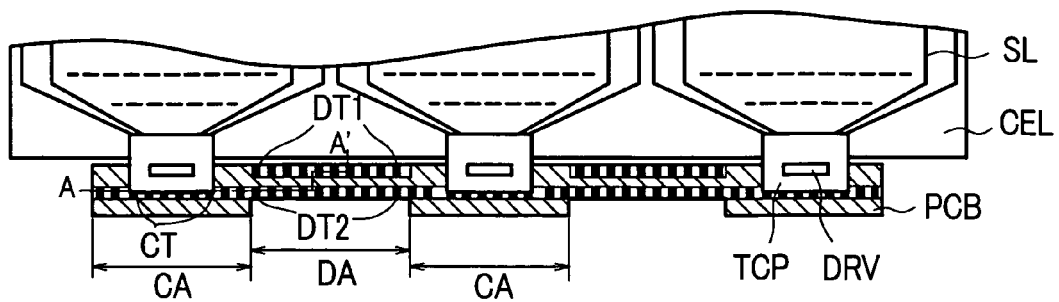
FIG. 1 is a schematic plan view of an essential part of a display device according to the present invention.

FIG. 1 is a schematic plan view of an essential part of a display device to which the present invention is applied.

Output terminals of flexible printed circuit boards TCP and input terminals of a display element CEL are respectively connected with each other and hence, signals are supplied to a large number of signal lines SL formed on the display element CEL. As the display element CEL, a liquid crystal display device, a self-luminous display device such as an organic EL display device or an inorganic EL display device, a field emission display device FED, a plasma display PDP or the like is applicable as an example. A printed circuit board PCB is arranged in a peripheral portion of the display element CEL. Connection terminal CT of the printed circuit board PCB and input terminals of the flexible printed circuit board TCP are connected with each other and hence, signals are supplied to the flexible printed circuit board TCP. The flexible printed circuit board TCP may be configured to directly supply signals from the connection terminals CT to the display element CEL. Alternatively, the display device may be configured such that a driver element DRV is formed on the flexible printed circuit board TCP, signals from the connection terminals CT are processed using the drive element DRV, and the signals after processing are supplied to the signal lines SL of the display element CEL.

A plurality of flexible printed circuit boards TCP are arranged with respect to the printed circuit board PCB. Due to such a constitution even when the display element CEL is large, it is possible to realize the supply of the signals to the whole required regions of the display element CEL. However, regions in which the flexible printed circuit board TCP is not formed are present between the plurality of flexible printed circuit boards TCP, when the present invention is not applied, the distribution of stress is generated on the printed circuit board PCB between the regions where the flexible printed circuit boards TCP are present and the regions where the flexible printed circuit boards TCP are not present and hence, warping is generated on the printed circuit board PCB. This warping is applied to the display element CEL as a stress thus causing the deterioration of the display quality due to the lowering of a contrast ratio of the display element CEL. Further, the warping per se of the printed circuit board PCB makes the mounting of the printed circuit board PCB on the display device difficult. For example, when a casing of the display device and the printed circuit board PCB are brought into contact with each other at unintended region due to the warping, the short-circuiting is generated and hence, the normal transmission of the signals becomes impossible. Further, the warping generates a stress on the connection portion between the printed circuit board PCB and the flexible printed circuit board TCP thus becoming a cause of the connection failure on the terminal portions with respect to the reliability.

In this embodiment, a plurality of connection terminal groups CT are formed on the printed circuit board PCB corresponding to the arrangement of the flexible printed circuit boards TCP. Further, between connection regions CA having these connection terminal groups CT respectively, dummy regions DA are arranged. Dummy terminals are arranged in the dummy regions. This constitution is provided for decreasing the warping of the printed circuit board PCB by arranging the electrodes on the connection regions CA as well as on the regions between the connection regions CA in the extending direction of the printed circuit board PCB.

This embodiment further has following constitutional features. That is, this embodiment is characterized in that, as the dummy terminal groups of the dummy regions DA, the first dummy terminal groups DT1 are arranged on a side close to the display element side CEL and the second dummy terminal groups DT2 are arranged on a side remote from the display element side CEL in the direction orthogonal to the extending direction of the printed circuit board PCB.

In such a constitution, in the dummy region DA, it is possible to make the arrangement rates of the dummy terminals on the side close to the display element and on the sides remote from the display element become close to each other in the direction orthogonal to the extending direction of the printed circuit board PCB. Accordingly, the generation of the warping in the short-side (lateral) direction of the board can be suppressed.

In this embodiment, in the dummy regions DA, the printed circuit boards PCB are formed in a notched shape or a recessed shape with respect to the connection regions CA. These notches or recesses provide advantageous effects that the notches or recesses absorb the warping or the deflection of the printed circuit board PCB, suppresses the warping of the printed circuit board PCB per se, and obviates the adverse influence to the display element CEL. On the other hand, due to the provision of these notches, a width of the printed circuit board PCB differs between the connection regions CA and the dummy regions DA. As a result, for example, even when the warping is obviated by arranging the connection terminal group CT on a center portion of the width of the printed circuit board PCB in the connection region CA, the dummy terminal groups are arranged to be shifted or offset from the center portion of the printed circuit board PCB in the dummy region DA. Accordingly, by adopting the constitution of this embodiment which provides the first dummy terminal groups DT1 and the second dummy terminal groups DT2, it is possible to obtain the well-balanced arrangement of the dummy terminals in the widthwise direction of the printed circuit board TCP in the dummy regions DA. Accordingly, it is possible to obtain the sufficient warping reduction effect attributed to the recesses formed in the printed circuit board PCB.

Figure 2:
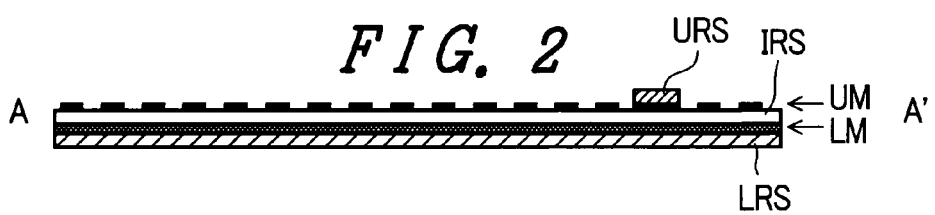
FIG. 2 is a schematic cross-sectional view taken along a line A-A' in FIG. 1 before an anisotropic conductive film ACF is formed.

FIG. 2 is a schematic cross-sectional structural view taken along a line A-A' in FIG. 1 before the connection is performed using an anisotropic conductive film ACF. The printed circuit board PCB is, as an example, constituted by sequentially arranging a lower resist layer LRS, a lower metal layer LM, an inner resist layer IRS, an upper metal layer UM and an upper resist layer URS from below. This layer constitution is increased corresponding to the increase of the number of line layers of the printed circuit board PCB. As can be understood from the drawing, at portions where the upper resist layer URS remains, the upper metal layer UM remains. Further, by removing the upper resist layer URS to expose the upper metal layer UM, the region can function as the terminal portion.

Figure 3:
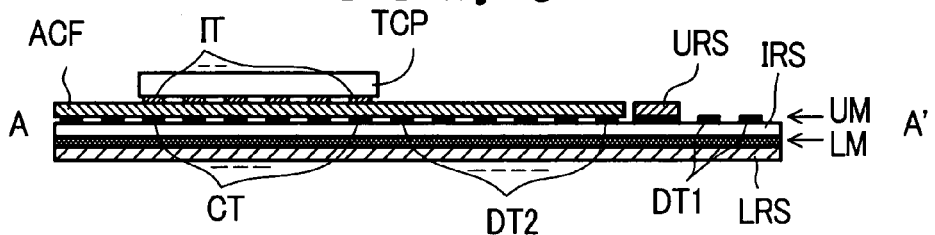
FIG. 3 is a schematic cross-sectional view taken along the line A-A' in FIG. 1 after the anisotropic conductive film ACF is formed.

FIG. 3 is a schematic cross-sectional structural view taken along the line A-A' in FIG. 1 after the anisotropic conductive film ACF is formed. As the anisotropic conductive film ACF, it is possible to use a generally known anisotropic conductive film which is produced by dispersing beads whose surfaces are coated with a conductive material such as gold in thermosetting resin. The anisotropic conductive film ACF extends not only over the connection terminals CT but also over the dummy terminal groups DT2 collectively. Since the anisotropic conductive film ACF is thermosetting, a stress is generated at the time of being cured and this stress becomes a cause of the warping. Accordingly, with respect to the arrangement of the anisotropic conductive film ACF, by allowing the connection regions CA and the dummy regions DA to have the same cross-sectional structure, the generation of the warping attributed to the non-uniform stress can be suppressed. In this embodiment, as an example, as shown in FIG. 1, by extending the connection terminals CT on the connection regions and the dummy terminal groups DT2 in the dummy regions on the same straight line, the above-mentioned suppression of the generation of the warping can be realized.

To the input terminals IT of the flexible printed circuit boards TCP, signals are supplied from the connection terminals CT through the anisotropic conductive film ACF. The second dummy terminal groups DT2 support the anisotropic conductive film ACF and suppress the imbalance of cross-sectional conditions.

Embodiment 2

Figure 4:
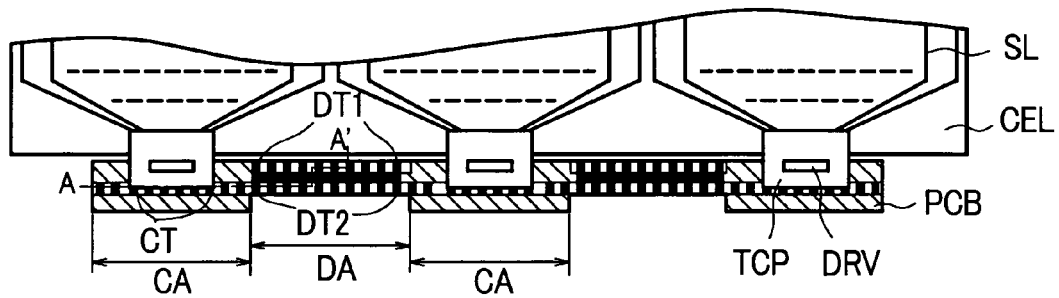
FIG. 4 is a schematic plan view of an essential part of another embodiment of the display device according to the present invention.
Figure 5:
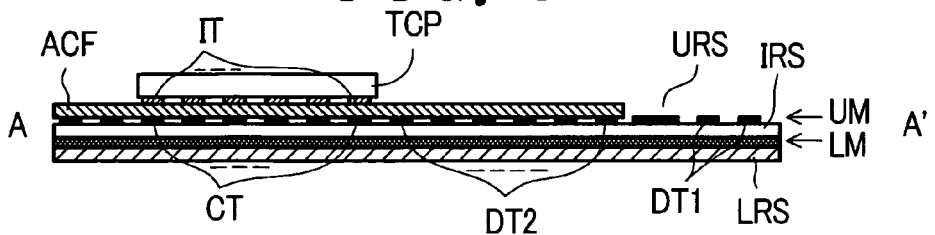
FIG. 5 is a schematic cross-sectional view taken along a line A-A' in FIG. 4.

FIG. 4 corresponds to FIG. 1 and FIG. 5 corresponds to FIG. 3. The constitution which makes this embodiment shown in FIG. 4 and FIG. 5 different from the constitution of the embodiment 1 shown in FIG. 1 and FIG. 3 lies in that the first dummy terminal groups. DT1 and the second dummy terminal groups DT2 are directly connected and are integrally formed with each other using the upper metal layer UM. Also in this embodiment, it is possible to achieve the same advantageous effects due to the reasons described in the embodiment 1.

Embodiment 3

Figure 6:
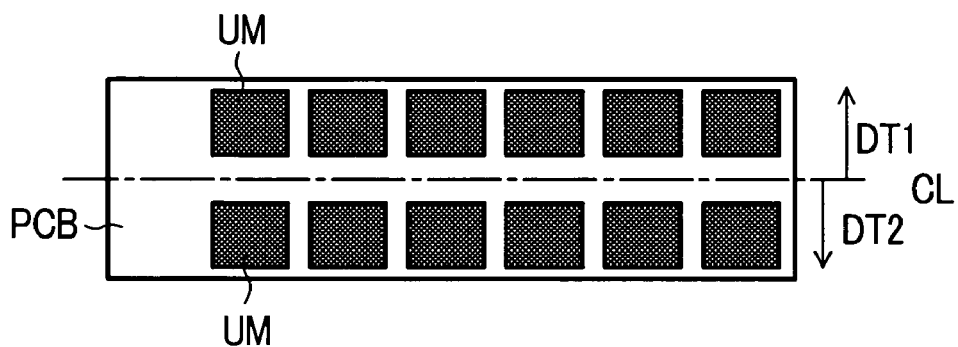
FIG. 6 is an explanatory view of an arrangement example of dummy terminal groups of the present invention.

FIG. 6 is a view for explaining the arrangement of the dummy terminal group in the dummy region DA. This arrangement is also applicable to the embodiment 1 or the embodiment 2.

With respect to a center line CL of the printed circuit board PCB in the dummy region DA, the first dummy terminal group DT1 is arranged on an upper side, that is, on a display element side, and the second dummy terminal group DT2 is arranged on a lower side, that is, on a side remote from the display element.

A pattern of the dummy terminals are formed using the above-mentioned upper metal layer UM.

By allowing the first dummy terminal group DT1 and the second dummy terminal group DT2 to have the approximately same pattern as shown in FIG. 6, the balanced pattern arrangement can be realized between the upper region and the lower region whereby the warping of the printed circuit board PCB can be suppressed.

Embodiment 4

Figure 7:
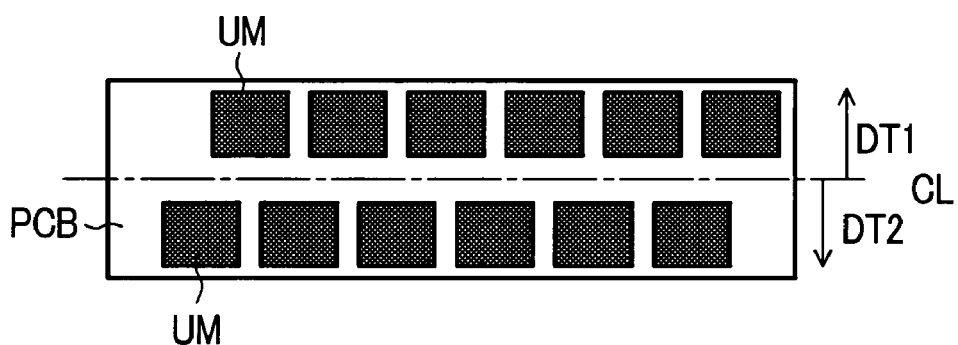
FIG. 7 is an explanatory view of an arrangement example of dummy terminal groups of the present invention.

FIG. 7 is a view for explaining the arrangement of the dummy terminal group in the dummy region DA. This arrangement is also applicable to the embodiment 1 or the embodiment 2.

With respect to a center line CL of the printed circuit board PCB in the dummy region DA, the first dummy terminal group DT1 is arranged on an upper side, that is, on a display element side, and the second dummy terminal group DT2 is arranged on a lower side, that is, on a side remote from the display element.

A pattern of the dummy terminals is formed using the above-mentioned upper metal layer UM.

As shown in FIG. 7, even when the first dummy terminal group DT1 and the second dummy terminal group DT2 are arranged in a state that these terminal groups DT1, DT2 are displaced from each other, provided that the balanced pattern arrangement is realized over the upper region as well as the lower region, it is possible to suppress the warping of the printed circuit board PCB.

Embodiment 5

Figure 8:
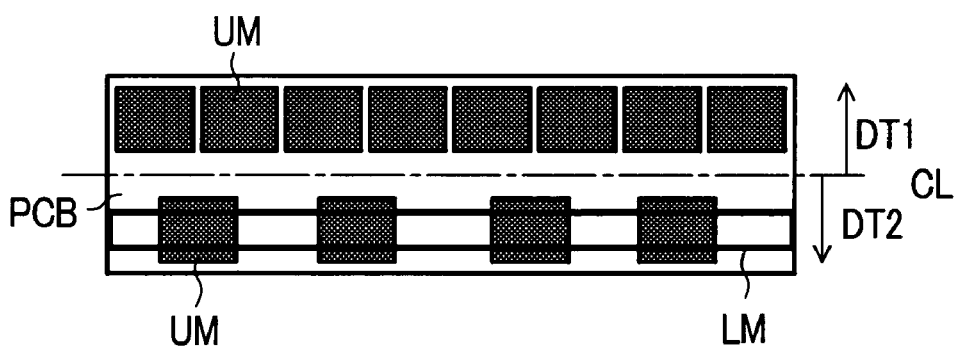
FIG. 8 is an explanatory view of an arrangement example of dummy terminal groups of the present invention.

FIG. 8 is a view for explaining the arrangement of the dummy terminal group in the dummy region DA. This arrangement is also applicable to the embodiment 1 or the embodiment 2.

With respect to a center line CL of the printed circuit board PCB in the dummy region DA, the first dummy terminal group DT1 is arranged on an upper side, that is, on a display element side, and the second dummy terminal group DT2 is arranged on a lower side, that is, on a side remote from the display element.

The dummy terminals are also formed of the lower metal layer LM in addition to the upper metal layer UM.

In FIG. 8, a pattern of the lower metal layer LM is largely formed in the lower region. Accordingly, to realize the balanced pattern arrangement, the upper metal layer UM is arranged in a large amount in the first dummy terminal group DT1 and is arranged in a small amount in the second terminal group DT2. Due to such a constitution, it is possible to realize the well balanced pattern arrangement over the upper region and the lower region over the whole metal layer hereby the warping of the printed circuit board PCB can be suppressed.

The display device having such a constitution can reduce the warping of the printed circuit board, and can obviate the adverse influence of the stress generated by the warping on the display and the unintentional contact of the printed circuit board with the casing of the display device attributed to the warping.

The above-mentioned respective embodiments may be used in a single form or in combination. This is because that the advantageous effect of the respective embodiments can be obtained in a single form or synergistically.

What is claimed is:

1. A display device comprising:
   a display element;
   a printed circuit board arranged to extend over a peripheral portion of the display element; and
   a plurality of flexible printed circuit boards which connect the display element and the printed circuit board, wherein
   the printed circuit board is connected with the plurality of flexible printed circuit boards using a plurality of connection terminals groups corresponding to the plurality of flexible printed circuit boards,
   first and second dummy terminals groups are provided in-between the plurality of connection terminal terminals groups,
   the first dummy terminals group is arranged on a side close to the display element side and the second dummy terminals group is arranged on a side remote from the display element side in a direction orthogonal to an extension direction of the printed circuit board, and
   a dummy terminal arrangement rate of the first dummy terminals group is made significantly identical to a dummy terminal arrangement rate of the second dummy terminals group.

2. A display device according to claim 1, wherein notches are formed corresponding to a region of the printed circuit board where the second dummy terminals group is arranged and on the side remote from the display element of the printed circuit board.

3. A display device according to claim 1, wherein an anisotropic conductive film which is contiguously formed over the connection terminals group and the second dummy terminals group.

4. A display device comprising:
   a display element;
   a printed circuit board arranged to extend over a peripheral portion of the display element; and
   a plurality of flexible printed circuit boards which connect the display element and the printed circuit board, wherein
   the printed circuit board is connected with the plurality, of flexible printed circuit boards using a plurality of connection terminal groups corresponding to the plurality of flexible printed circuit boards,
   first and second dummy terminals groups are provided in-between the plurality of connection terminals groups, the first dummy terminals group is arranged on a side close to the display element side and the second dummy terminals group is arranged on a side remote from the display element side in a direction orthogonal to an extension direction of the printed circuit boar, and a number of the first dummy terminals of the a first dummy terminals groups arranged in an area is made significantly identical to a number of the second dummy terminals of the second dummy terminal groups arranged in an area with an identical size as said area.

5. A display device according to claim 4, wherein notches are formed corresponding to a region of the printed circuit board where the second dummy terminals coup is arranged and on the side remote from the display element of the printed circuit board.

6. A display device according to claim 4, wherein an anisotropic conductive film which is contiguously formed over the connection terminals group and the second dummy terminals group.

* * * * *